(12) United States Patent
Brockmeier et al.

(10) Patent No.: US 12,372,780 B2
(45) Date of Patent: Jul. 29, 2025

(54) 3D DOME WAFER-LEVEL PACKAGE FOR OPTICAL MEMS MIRROR WITH REDUCED FOOTPRINT

(71) Applicant: Infineon Technologies AG, Neubiberg (DE)

(72) Inventors: Andre Brockmeier, Villach (AT); Ulf Bartl, Villach (AT); Kurt Sorschag, Villach (AT)

(73) Assignee: Infineon Technologies AG, Neubiberg (DE)

( * ) Notice: Subject to any disclaimer, the term of this patent is extended or adjusted under 35 U.S.C. 154(b) by 702 days.

(21) Appl. No.: 17/690,158

(22) Filed: Mar. 9, 2022

(65) Prior Publication Data

US 2023/0288695 A1 Sep. 14, 2023

(51) Int. Cl.
*G02B 26/08* (2006.01)
*B81B 7/00* (2006.01)
*B81C 1/00* (2006.01)

(52) U.S. Cl.
CPC .......... *G02B 26/085* (2013.01); *B81B 7/0038* (2013.01); *B81B 7/0067* (2013.01); *B81C 1/00285* (2013.01); *B81C 1/00317* (2013.01); *B81B 2201/042* (2013.01); *B81C 2203/0118* (2013.01)

(58) Field of Classification Search
CPC .............. G02B 26/085; G02B 26/0833; G02B 26/0841; B81B 7/0038; B81B 7/0067; B81B 2201/042; B81B 7/0032; B81B 7/02; B81C 1/00285; B81C 1/00317; B81C 2203/0118; B81C 1/00261
See application file for complete search history.

(56) References Cited

U.S. PATENT DOCUMENTS

| 11,531,196 | B2 † | 12/2022 | Quenzer |
| 2007/0024549 | A1 † | 2/2007 | Choi |
| 2020/0159006 | A1 | 5/2020 | Quenzer et al. |
| 2023/0127991 | A1* | 4/2023 | Lee ..................... G02B 26/101 359/198.1 |

FOREIGN PATENT DOCUMENTS

DE 102021116165 B3 † 10/2022

OTHER PUBLICATIONS

Letter—3rd Party Submission of Prior Art.†

* cited by examiner
† cited by third party

*Primary Examiner* — Euncha P Cherry
(74) *Attorney, Agent, or Firm* — Harrity & Harrity, LLP

(57) ABSTRACT

A microelectromechanical systems (MEMS) mirror package assembly includes: a MEMS wafer including a stator portion and a rotor portion that includes a MEMS mirror configured to rotate about an axis, wherein the MEMS mirror is suspended over a back cavity, wherein the MEMS wafer defines a first portion of the back cavity; a spacer wafer, wherein the backside of the spacer wafer is bonded to the frontside of the MEMS wafer, wherein the spacer wafer defines a first portion of a front cavity arranged over the MEMS mirror; a transparent cover wafer, wherein the backside of the transparent cover wafer is bonded to the frontside of the spacer wafer, wherein the transparent cover wafer includes a transparent dome structure arranged over the MEMS mirror and defining a second portion of the front cavity. The center of the MEMS mirror is arranged substantially at a vertex of the transparent dome structure.

26 Claims, 10 Drawing Sheets they place high demands on hermetic tightness and reproducibility. In addition, the handling and construction of three-dimensional package structures are difficult.

3D DOME WAFER-LEVEL PACKAGE FOR OPTICAL MEMS MIRROR WITH REDUCED FOOTPRINT

BACKGROUND

Today, new microelectromechanical system (MEMS) technologies place completely new demands on their package. In particular, for optical applications such as MEMS micromirrors used in laser beam scan applications or optical gas sensors (e.g., microoptoelectromechanical systems (MOEMS)), optical access for the light measurement signals to the respective MEMS device, for example, in the form of transparent glass, is required. Since parameters such as transmission and reflection are important parameters for the package quality for optical applications, it is usually necessary to generate the package geometries in three dimensions. If the transparent cover glass is designed, for example, plane-parallel, the reflection of the primary beam is in the field-of-view of the optical MEMS structure (i.e., the MEMS micromirror or microscanner), where it outshines the signal being scanned through. The result is a bright point in the projected image field. If, on the other hand, the cover glass is designed with a precisely specified angle to the signal access for the device, then possible losses, reflection interference, or signal noise in the projected image field can be minimized or avoided entirely.

The package implementation for optical components nowadays essentially takes place in hybrid construction, which is not only very complex and cost-intensive, but also places high demands on hermetic tightness and reproducibility. In addition, the handling and construction of three-dimensional package structures are difficult.

The package or the top lid glass can be designed in the shape of a hemisphere to minimize losses, reflection interference, or signal noise. Namely, the radius of curvature of the hemisphere also prevents the incident signal from being reflected into the microscanner's projection field. The disadvantage of this solution is that the minimum component size of the MEMS is limited by the necessary hemisphere (bubble) of the glass, since the mirror surface lying under the hemisphere must always be exactly centered at the vertex of the hemisphere (half the diameter of a sphere). In other words, these types of packages are relatively large.

Therefore, an improved wafer-level package for MEMS scanners with a 3D dome-shaped transparent cover and a reduced footprint may be desirable.

SUMMARY

One or more embodiments provide a microelectromechanical systems (MEMS) mirror package assembly, including: a MEMS wafer including a stator portion that is rotationally fixed and a rotor portion that includes a MEMS mirror configured to rotate about at least one axis, wherein the MEMS mirror is suspended from the stator portion over a back cavity, the MEMS wafer including a frontside and a backside, wherein the MEMS wafer defines a first portion of the back cavity; a spacer wafer including a frontside and a backside, wherein the backside of the spacer wafer is bonded to the frontside of the MEMS wafer, wherein the spacer wafer defines a first portion of a front cavity arranged over the MEMS mirror; a transparent cover wafer including a frontside and a backside, wherein the backside of the transparent cover wafer is bonded to the frontside of the spacer wafer, wherein the transparent cover wafer includes a transparent dome structure arranged over the MEMS mirror and defining a second portion of the front cavity. The center of the MEMS mirror is arranged substantially at a vertex of the transparent dome structure.

One or more embodiments provide a method of manufacturing a MEMS mirror package assembly, the method of manufacturing including: structuring a first portion of a front cavity in a spacer wafer, wherein the first portion of the front cavity extends vertically into the spacer wafer by extending from a frontside of the spacer wafer partially towards a backside of the spacer wafer; hermetically bonding a transparent cover wafer to the frontside of the spacer wafer, wherein the transparent cover wafer includes a frontside and a backside that are substantially flat, wherein the backside of the transparent cover wafer encloses the first portion of a front cavity; pressurizing the first portion of a front cavity with an overpressure; heating the transparent cover wafer to at least a transition temperature of the transparent cover wafer at which the transparent cover wafer transitions into a viscous or rubbery state, wherein heating the transparent cover wafer to a softening point of the transparent cover wafer and the overpressure causes a portion of the transparent cover wafer that is arranged over the first portion of a front cavity to bulge into a bubble to thereby form a transparent dome structure that defines a second portion of the front cavity; and hermetically bonding the backside of the spacer wafer to a frontside of a MEMS wafer, wherein the MEMS wafer includes a stator portion that is rotationally fixed and a rotor portion that includes a MEMS mirror configured to rotate about at least one axis, wherein the MEMS mirror is suspended from the stator portion over a back cavity, wherein the MEMS wafer defines a first portion of the back cavity, wherein a center of the MEMS mirror is arranged substantially at a vertex of the transparent dome structure.

BRIEF DESCRIPTION OF THE DRAWINGS

Embodiments are described herein making reference to the appended drawings.

DETAILED DESCRIPTION

Figure 1A:
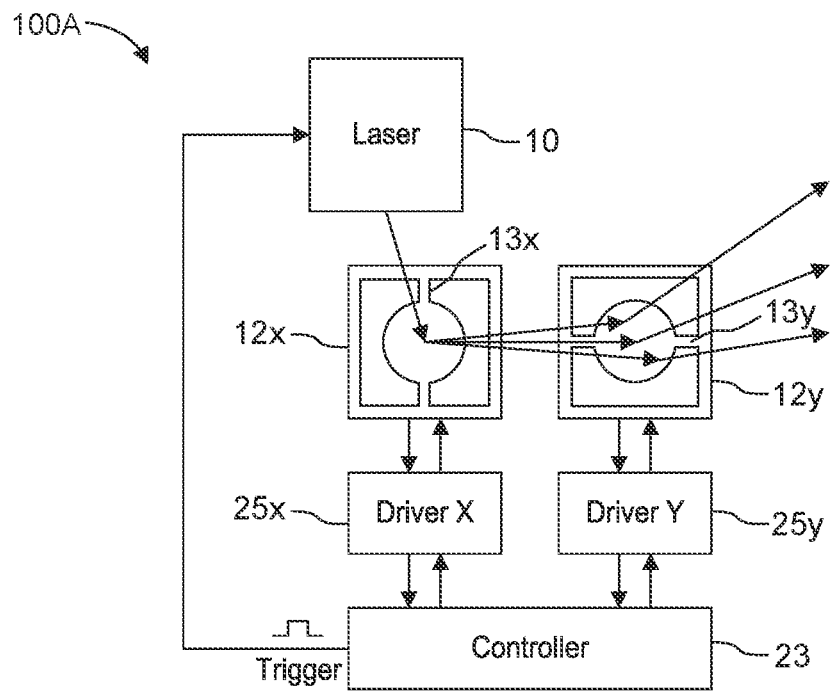
FIGS. 1A and 1B are a schematic block diagrams of scanning systems according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation. For example, lateral, vertical, and overlapping spatial or positional relationships may be described in reference to another element or feature, without being limited to a specific orientation of the device as a whole.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Embodiments relate to optical transmitters and optical transmitter systems configured to transmit light beams or pulses. Light beams include visible light, infrared (IR) light, or other type of illumination signals. In some applications, the transmitted light may be backscattered by an object back towards the system where the backscattered light is detected by a sensor. The sensor may convert the received backscattered light into an electric signal, for example a current signal or a voltage signal, that may be further processed by the system to generate object data and/or an image.

For example, in Light Detection and Ranging (LIDAR) systems, a light source transmits light beams into a field of view and the light reflects from one or more objects by backscattering. One or more microelectromechanical system (MEMS) mirrors may be arranged to receive the transmitted light beams and steer (scan) the transmitted light beams into the field of view to perform a scanning of the environment.

In other applications, such as wearable augmented reality goggles, a MEMS mirror may be arranged to receive the transmitted light beams and steer (scan) the transmitted light beams onto a retina of a human eye in order to render an image thereon.

Figure 1B:
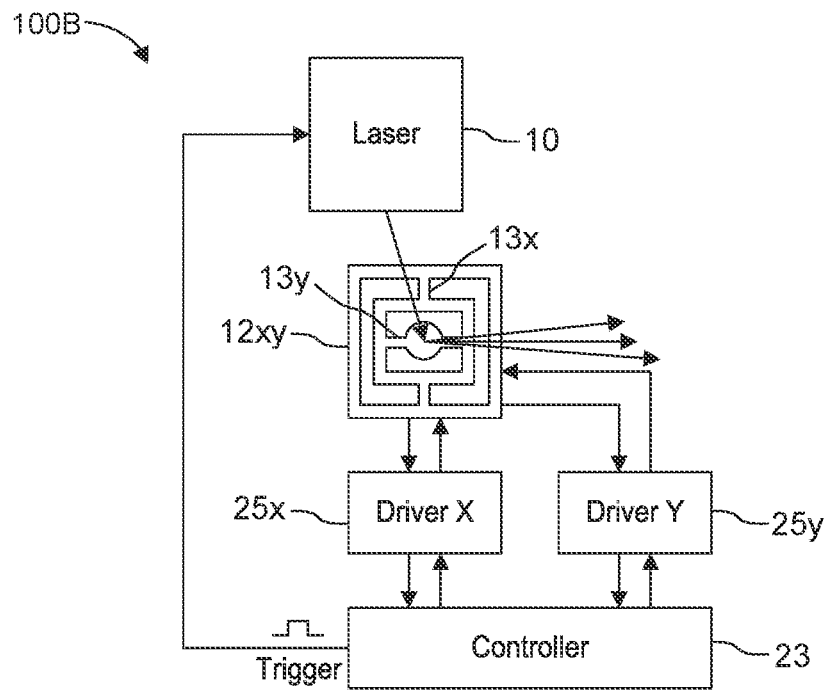

FIGS. 1A and 1B are schematic block diagrams of scanning systems 100A and 100B, respectively, according to one or more embodiments. In particular, the scanning system 100A includes two one-dimensional (1D) MEMS mirrors $12x$ and $12y$ that are used to steer or otherwise deflect light beams (pulses) according to a scanning pattern. In contrast, the scanning system 100B includes a single two-dimensional (2D) MEMS mirror $12xy$ that is used to steer or otherwise deflect light beams (pulses) according to a scanning pattern. Of course, in certain applications, a single 1D MEMS mirror (i.e., MEMS mirror $12x$ or $12y$) may also be used to perform a scanning function.

The MEMS mirrors $12x$ and $12y$ are mechanical moving mirrors (i.e., a MEMS micro-mirror) integrated on a semiconductor chip (not shown). A MEMS mirror according to the embodiments described herein is suspended by mechanical springs (e.g., leaf springs, sometimes referred to as cantilever beams) or flexures and is configured to rotate or oscillate via rotation about either a single scanning axis (i.e., a 1D MEMS mirror) or two scanning axes (i.e., a 2D MEMS mirror) that are typically orthogonal to each other. Each MEMS mirror is formed out of a semiconductor wafer (i.e., a MEMS wafer) that includes a stator portion that is rotationally fixed and a rotor portion that includes the MEMS mirror. The MEMS mirror is suspended from the stator portion over a back cavity. The back cavity is provided to provide a MEMS mirror with sufficient free space for rotation about each rotation axis. The MEMS wafer is formed in a way that it defines at least a portion of the back cavity.

The MEMS wafer may include a plurality of MEMS mirrors that will be later singulated in a dicing process. The MEMS wafer may further include through-silicon vias (TSVs) (i.e., conductive interconnects) that will later provide each MEMS mirror with an electrical connection to an electrical interface. Conductive lines may also be formed from top to bottom along a side wall of the MEMS chips after singulation. It is to be noted that the mechanical springs, and actuation structures, the stator portion, and the rotor portion that includes the mirror body are all formed from the MEMS wafer (e.g., via etching and other semiconductor processing methods) as one-piece integral member. In other words, all parts of the MEMS chip are formed from the MEMS wafer itself. A reflective coating is deposited on the mirror body portion of the MEMS wafer to form the reflective surface of the mirror.

An oscillation of the MEMS mirror on a scanning axis may be driven at a resonance frequency between two predetermined extremum deflection angles (e.g., +/−15 degrees). A scanner with two orthogonal axes is configured to control the steering of the light beams in two dimensions (e.g., in a horizontal x-direction and in a vertical y-direction), whereas a scanner with only one 1D MEMS mirror is configured to control the steering of the light beams in one dimension.

In the example shown in FIG. 1A, two 1D MEMS mirrors 12x and 12y are used to steer light beams in two dimensions. MEMS mirror 12x includes a first scanning axis 13x that enables the MEMS mirror 12x to steer light in the x-direction, whereas MEMS mirror 12y includes a second scanning axis 13y that enables the MEMS mirror 12yx to steer light in the y-direction. The two MEMS mirrors 12x and 12y are arranged sequentially along a transmission path of the light beams such that one of the MEMS mirrors (e.g., MEMS mirror 12x) first receives a light beam and steers it in a first dimension and the second one of the MEMS mirrors (e.g., MEMS mirror 12y) receives the light beam from the first MEMS mirror and steers it in a second dimension. As a result, the two MEMS mirrors 12x and 12y operate together to steer a light beam generated by an illumination unit 10 in two-dimensions. In this way, the two MEMS mirrors 12x and 12y can direct a light beam at a desired 2D coordinate (e.g., an x-y coordinate). Multiple light beams can be steered by the two MEMS mirrors 12x and 12y at different 2D coordinates of a scanning pattern.

In another example illustrated in FIG. 1B, one 2D MEMS mirror 12xy is used to steer light beams in two dimensions. MEMS mirror 12xy includes the first scanning axis 13x that enables the MEMS mirror 12xy to steer light in the x-direction and the second scanning axis 13y that enables the MEMS mirror 12xy to steer light in the y-direction. In this way, a single MEMS mirror is able to steer light beams received from the illumination unit 10 in both the x-direction and the y-direction. As a result, the MEMS mirror 12xy can direct a light beam at a desired 2D coordinate (e.g., an x-y coordinate). Multiple light beams can be steered by the MEMS mirror 12xy at different 2D coordinates of a scanning pattern.

A driving signal is used for each scanning axis in order to drive a MEMS mirror about that scanning axis. Thus, MEMS mirror 12x receives a driving signal for being driven about the first scanning axis 13x, MEMS mirror 12y receives a driving signal for being driven about the second scanning axis 13y, and MEMS mirror 12xy receives a first driving signal for being driven about the first scanning axis 13x and a second driving signal for being driven about the second scanning axis 13y. A driving signal results in a driving force that causes the MEMS mirror to rotate a respective scanning axis, and can be used to create an oscillating driving force to drive a MEMS mirror at a resonance frequency about the respective scanning axis.

Each MEMS mirror 12x, 12y, and 12xy may be a resonator (i.e., a resonant MEMS mirror) configured to oscillate "side-to-side" about each of its scanning axes at a resonance frequency such that the light reflected from the MEMS mirror oscillates back and forth in a scanning direction of a respective scanning axis.

For each scanning axis, a MEMS mirror includes an actuator structure used to drive the MEMS mirror about that scanning axis. The actuator structure includes interdigitated finger electrodes made of interdigitated mirror combs on the rotor side and frame combs on the stator side to which a driving voltage is applied by its driver (e.g., driver 25x or 25y). The driving voltage applied to the finger structure generates a corresponding torque. Thus, a MEMS mirror itself represents a capacitor whose capacitance changes with the rotational angle of the MEMS mirror about its scanning axis.

The driving voltage across the finger structure creates a driving force between interdigitated mirror combs and the frame combs, which creates a torque on the mirror body about the rotation axis. The driving voltage can be switched or toggled high/low resulting in an oscillating driving force. The oscillating driving force causes the mirror to oscillate back and forth on its scanning axis between two extrema. As the mirror oscillates, the capacitance between the finger electrodes changes according to the mirror's rotation position. The MEMS driver is configured to measure the capacitance between the interdigitated finger electrodes, and determine a rotation position or angle position of the MEMS mirror therefrom. By monitoring the capacitance, the MEMS driver can track the rotation position of the MEMS mirror as well as detect the zero-crossing events (i.e., instances at which the rotation angle is zero) and a timing thereof.

For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific position (i.e., rotation angle) of the MEMS mirror. By sensing the capacitance of the finger structure, a specific position of the MEMS mirror can be determined.

One way to measure the capacitance is to measure a current flowing through the finger structure, convert the measured current into a voltage, and then further correlate the voltage to a capacitance and/or rotation angle. However, any method to measure the capacitance may be used. A rotation direction (e.g., positive or negative, left-to-right or right-to-left, clockwise or counter-clockwise, etc.) is also detected by measuring a change in capacitance over time, where a positive or a negative change indicates opposing rotation directions.

The scanning systems 100A and 100B each includes an illumination unit 10 (i.e., a light transmitter) that includes at least one light source (e.g., at least one laser diode or light emitting diode) that is configured to transmit light beams (pulses) along a transmission path towards the MEMS mirror(s). The illumination unit 10 may sequentially transmit multiple light pulses according to a trigger signal received from a system controller 23.

The scanning systems 100A and 100B also include a system controller 23 that is configured to control components of the scanning systems. In certain applications, such as LIDAR, the system controller 23 may also be configured to receive raw data from a light sensor (not illustrated) and perform processing thereon (e.g., via digital signal processing) for generating object data (e.g., point cloud data). Thus, the system controller 23 includes at least one processor and/or processor circuitry (e.g., comparators, time-to-digital converters (TDCs), analog-to-digital converters (ADCs), and digital signal processors (DSPs)) of a signal processing chain for processing data, as well as control circuitry, such as a microcontroller, that is configured to generate control signals.

The system controller 23 is configured to generate a trigger signal used to trigger the illumination unit 10 to generate light pulses. Thus, the system controller 23 controls the timing light pulses are fired from the illumination unit 10 via the trigger signal. The system controller 23 is also configured to set a driving frequency of a MEMS mirror for each of its scanning axes and is capable of synchronizing the oscillations about the two scanning axes 13x and 13y.

The scanning systems 100A and 100B both include a MEMS driver 25x for driving a MEMS mirror (i.e., MEMS mirror 12x or 12xy) about the first scanning axis 13x and a MEMS driver 25y for driving a MEMS mirror (i.e., MEMS mirror 12y or 12xy) about the second scanning axis 13y. Each MEMS driver 25x, 25y actuates and senses the rotation position of the mirror about its respective scanning axis, and provides position information (e.g., tilt angle or degree of rotation about the rotation axis) of the mirror to the system controller 23. Based on this position information, the laser sources of the illumination unit 10 may be triggered by the system controller 23. Thus, a higher accuracy in position sensing of the MEMS mirror results in a more accurate and precise control of other components of the scanning system.

A drive voltage (i.e., an actuation or driving signal) is applied by a MEMS driver to an actuator structure of the MEMS mirror that corresponds to its corresponding scanning axis to drive the oscillation of the MEMS mirror about that scanning axis. The drive voltage may be referred to as a high-voltage (HV) signal. The actuator structure may include interdigitated finger electrodes made of interdigitated mirror combs and frame combs to which a drive voltage (i.e., an actuation or driving signal) is applied by the MEMS driver. The drive voltage applied to the actuator structure creates a driving force between, for example, interdigitated mirror combs and the frame combs, which creates a torque on the mirror body about the rotation axis.

The drive voltage can be switched or toggled between two or more voltage values, including a low voltage (LV) level and a high voltage (HV), resulting in an oscillating driving force in order to produce mirror oscillation. The oscillating driving force causes the mirror to oscillate back and forth on its rotation axis between two extrema. For simplicity, a rectangular waveform with two levels, i.e., the LV level and the HV level, is discussed as only an example. When the HV level is generated, it can be said that the HV level is on (i.e., HV_On) and when the LV level is generated, it can be said that the HV level is off (i.e., HV_Off).

The embodiments aim at generating a 3D wafer level package suitable for optical MEMS applications with dome-like glass structures that are produced with the help of a glass reflow. A spacer wafer used for production is not removed, but integrated with the overall wafer stack. This has the advantage that the requirements for cavity pressure, the required cavity depth and the footprint of the package can be greatly minimized, which ultimately benefits the final application. The overall device can thus be made smaller. The reduced dome height results in advantages when separating the MEMS wafer after packaging, since the spindle of the mechanical saw that holds the saw blade has to cover a smaller topography and/or the dicing blade needs less exposure. If the height of the dome is reduced, the exposure of the blade can be reduced. The more exposure, the thicker the blade. The blade thickness correlates to the needed kerf/dicing street width. The time-consuming, costly step of removing the spacer wafer is also eliminated. Thus, the embodiments combine a disadvantageous need for a spacer wafer by also integrating the spacer wafer into the package.

Figure 2A:
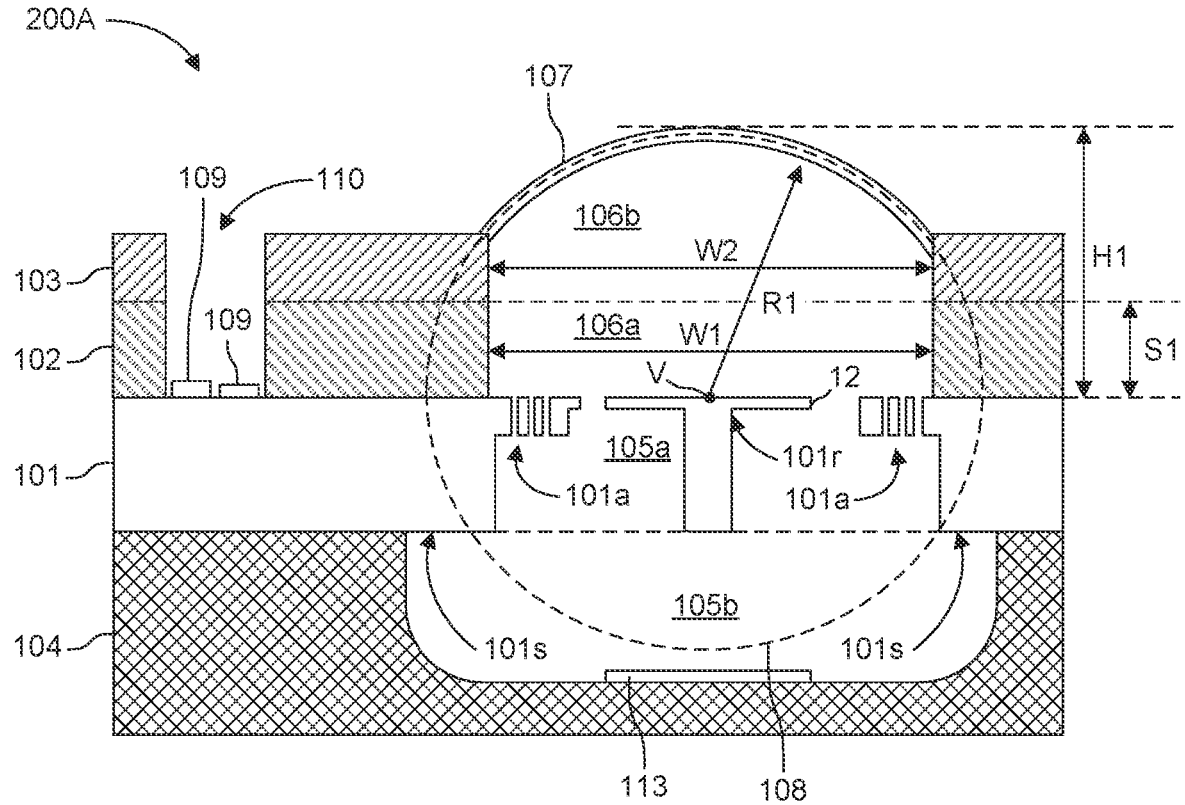
FIGS. 2A-2C are cross-sectional views of a variations of a MEMS mirror package assembly according to one or more embodiments.
Figure 2B:
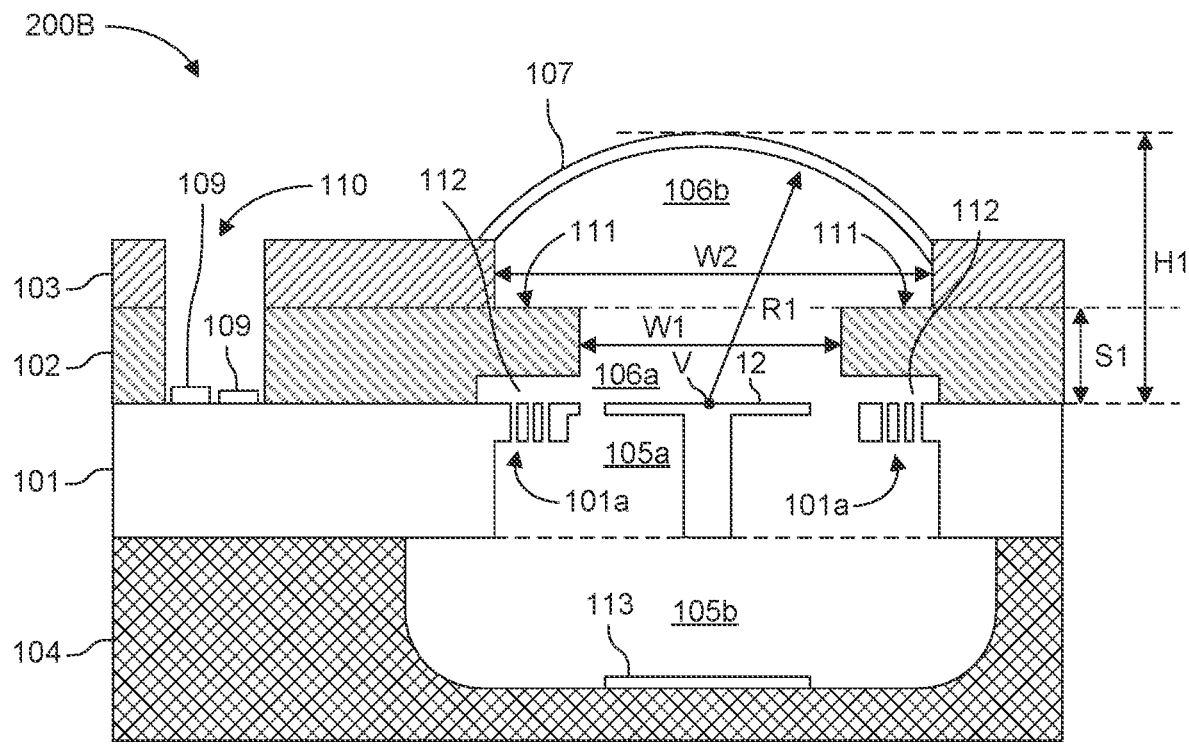
Figure 2C:
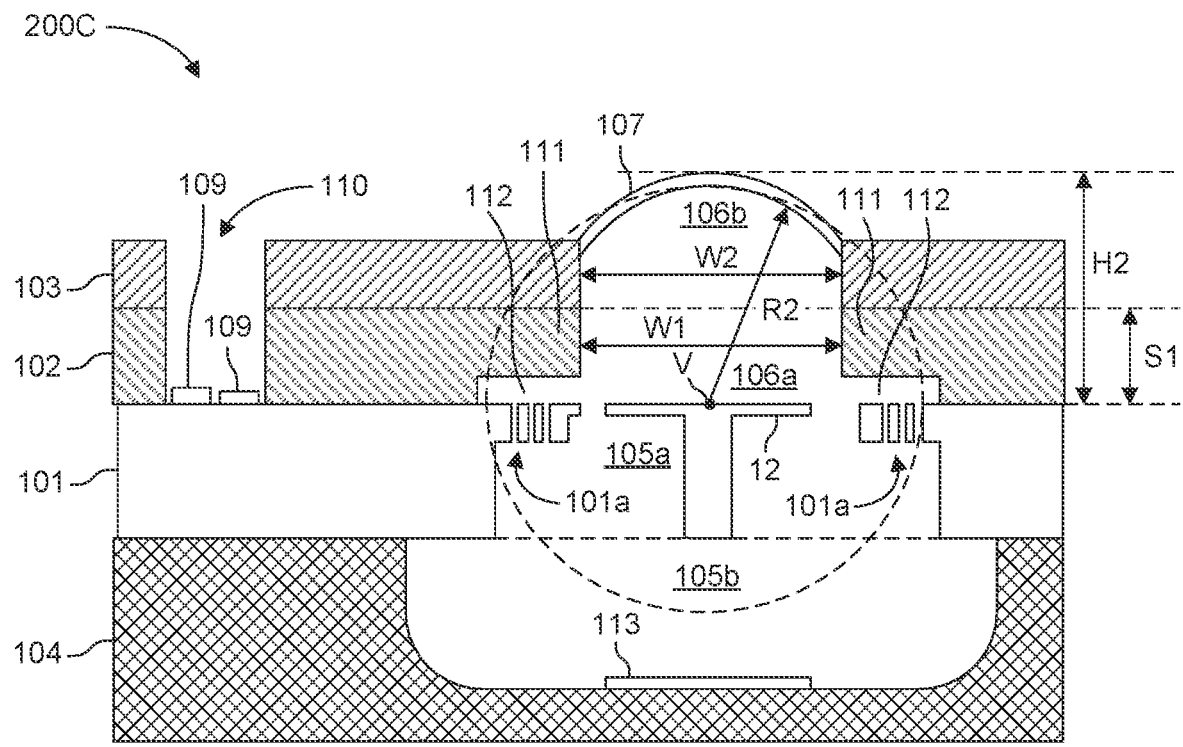

FIGS. 2A-2C are cross-sectional views of a variations of a MEMS mirror package assembly according to one or more embodiments. In particular, FIG. 2A illustrates a MEMS mirror package assembly 200A, FIG. 2B illustrates a MEMS mirror package assembly 200B, and FIG. 2C illustrates a MEMS mirror package assembly 200C.

Starting with FIG. 2A, the MEMS mirror package assembly 200A includes a MEMS wafer 101 comprising a frontside (top side), a backside (bottom side), a stator portion 101s that is rotationally fixed, and a rotor portion 101r that includes a MEMS mirror 12 configured to rotate about at least one axis. The MEMS mirror 12 is suspended from the stator portion 101s over a back cavity 105 via spring structures (not illustrated). The back cavity 105 includes back cavity portions 105a and 105b. The MEMS wafer 101 defines a first portion 105a of the back cavity 105. The back cavity 105 under the MEMS mirror 12 provides the necessary space for the mirror to move. The MEMS wafer 101 also includes actuation structures 101a (i.e., finger electrodes) formed therein. As noted above, the actuation structures 101a are configured to actuate a rotation of the MEMS mirror 12 about at least one rotation axis.

The MEMS mirror package assembly 200A further includes a spacer wafer 102 that also includes a frontside (top side) and a backside (bottom side). The backside of the spacer wafer 102 is hermetically bonded to the frontside of the MEMS wafer 101. In addition, the spacer wafer 102 defines a first portion 106a of a front cavity 106 arranged over the MEMS mirror 12.

The MEMS mirror package assembly 200A further includes a transparent cover wafer 103 (e.g., a glass wafer) that also includes a frontside (top side) and a backside (bottom side). The backside of the transparent cover wafer 103 is hermetically bonded to the frontside of the spacer wafer 102. In addition, the transparent cover wafer 103 comprises a transparent dome structure 107 arranged over the MEMS mirror 12 and defining a second portion 106b of the front cavity 106.

The transparent cover wafer 103 may be referred to as a transmission substrate, transmission lid, transmission window, transmission cap, or transmission cover that is configured to bidirectionally transmit light therethrough. In addition, the above uses of "transmission" may be replaced with "optical." In addition, as used herein, "transmission" may include both receiving and transmitting light, including the receiving and transmitting light through an object such as the transparent cover wafer 103. Thus, the transparent cover wafer 103 enables the MEMS mirror 12 to receive light beams from an external light source and further enables the MEMS mirror 12 to transmit the light beams via reflection out from the package into a field of view.

The shape and position of the transparent dome structure 107 relative to the MEMS mirror 12 reduces optical effects, such as preventing the incident signal from being reflected into the MEMS mirror's projection field and preventing internal reflections from occurring inside the package. Accordingly, static reflection, ghost beams, and blurring of an image can be reduced or eliminated.

In this example, the width W1 of the first portion 106a of the front cavity 106 defined by the spacer wafer 106 is equal to a width W2 of the second portion 106b of the front cavity 106 defined by the transparent cover wafer 103. The cavity 106a of the spacer wafer 102 is needed for reshaping the transparent cover wafer 103 to form the transparent dome structure 107 from a flat wafer.

The transparent dome structure 107 in three-dimensions may be semi-shelled, spherical, or ellipsoidal in shape. From the cross-sectional view, the transparent dome structure 107 has a maximum vertical height H1 from the MEMS wafer, a radius R1, and a curvature that forms an imaginary circle 108 around the MEMS mirror 12, with the center of the MEMS mirror 12 is arranged substantially at the center of the imaginary circle 108. In other words, the center of the MEMS mirror 12 is arranged substantially at a vertex V of the transparent dome structure 107. Since the rotation axis 13 of the MEMS mirror 12 bisects the center of the MEMS mirror 12, the rotation axis 13 may also intersect with the center of the circle.

The MEMS mirror package assembly 200A further includes a cavity wafer 104 whose frontside is hermetically bonded to the backside of the MEMS wafer 101. The cavity wafer 104 includes a back cavity recess 105b that defines a second portion 105b of the back cavity 105. The cavity wafer 104, the spacer wafer 102, the MEMS wafer 101, and the transparent cover wafer 103 form an enclosed volume 105a, 105b, 106a, and 106b around the MEMS mirror 12, where the enclosed volume comprises the front cavity 106 and the back cavity 105. Because all wafer layers are hermetically bonded to their adjacent wafers, the enclosed volume is a hermetically sealed volume. The enclosed volume has either a vacuum pressure or a low pressure (e.g., less than 500 millibar) so that a damping effect on the rotation of the MEMS mirror 12 is minimized. Sometimes the pressure is to be adjusted in this low-pressure range by re-fill to realize a specific optimized value for the Q-factor for a specific design, where the value has been predetermined based on the scanner design parameters, available actuation forces, maximally allowed energy consumption, and settling requirements of the control circuitry.

The MEMS mirror package assembly 200A further includes at least one electrical pad 109 formed at the frontside of the MEMS wafer 101. The at least one electrical pad 109 may be used to transmit electrical signals to or receive electrical signals from the MEMS wafer 101, and, more specifically, the MEMS chip. For example, an electrical pad 109 may receive driving signals used to drive the MEMS mirror 12 or an electrical pad 109 may be used to receive a sensing current for measuring a rotational position of the MEMS mirror 12.

The MEMS mirror package assembly 200A further includes an opening 110 arranged over the electrical pads 109, wherein the opening extends entirely through a thickness of the transparent cover wafer 103 and a thickness S1 of the spacer wafer 102 to expose the electrical pads 109. The opening 110 is laterally displaced from the transparent dome structure 107 by some lateral distance.

The MEMS mirror package assembly 200A further incudes a getter structure 113 arranged inside the enclosed volume 105a, 105b, 106a, and 106b. Here, the getter structure 113 is disposed on an internal surface of the cavity wafer 104. A getter is a deposit of reactive material that is placed inside a vacuum or low-pressure system, for the purpose of completing and maintaining the vacuum or low pressure. When gas molecules strike the getter material, they combine with it chemically or by absorption. Thus, the getter removes small amounts of gas from the evacuated or low-pressure space. The getter can be a coating applied to a surface within the evacuated chamber. Thus, the getter structure 113 serves the purpose to gettering any kind of gas residues (e.g., carbon-based gases) which are present during bonding, for example, with glass frit. Outgassing of the organic glass frit components during bonding and sealing can lead to a pressure increase in the hermetic sealed cavity made up of 105a, 105b, 106a, and 106b and therefore has a direct impact on the damping and Q-factor of the MEMS mirror 12.

In one example, the getter structure 113 is made of titanium Ti, zirconium Zr, or iron Fe and is evaporated (e.g., physical vapor deposition (PVD) or sputtering) after the cavity wafer 104 is pre-structured. Beside PVD methods, inkjet printing is capable of depositing the getter, which is also advantageous in terms of the getter performance since the rough surface of printed films will increase surface area. The getter thickness can vary between 100-800 nm. In case of Ti, the structuring of the getter can be done by wet etching in diluted HF-solutions (typical ~1%). Dry etching methods may be possible as well.

If the getter material is applied on the complete cavity wafer 104 (e.g., by PVD), the area where the getter should remain should be protected with a material that can withstand the wet/dry etching. Resists and imides can be used as mask material (hardmask materials like nitrides, SiC, aCH work as well (depending on the etching solution/gases) but integration is more complex).

Spin- or spray-coating or inkjet-printing can be applied to deposit the resist/imide. The big advantage of using inkjet printing in the present case is that this process has more freedom with respect to the high topography (cavity depth). Normal lithography processes like coating, exposure and development are quite challenging due to this high topography. After etching the getter structure in the cavity (105b), the getter structure 113 acts as a getter for oxygen, hydrogen or carbon-based gases like $CO_2$.

Referring to FIGS. 2B and 2C, the MEMS mirror package assemblies 200B and 200C each have a spacer wafer 102 that includes protrusion structures 111 that laterally extend over the actuation structures 101a, thereby providing additional protection to the actuation structures 101a. The lateral extension of the spacer wafer 102 provides the possibility the reduce W1 without impacting the movement of the actuation structures due to the recess 112. Reducing W1 can also result in reducing height H1.

In FIG. 2B, the transparent cover wafer 103 to does protrude out over the actuation structures 101a such that a wider range of light receiving angles and light transmission angles are possible. As a result, the width W1 of the first portion 106a of the front cavity 106 defined by the spacer wafer 102 is less than a width W2 of the second portion 106b of the front cavity 106 defined by the transparent cover wafer 103.

The first portion 106a of the front cavity 106 includes recesses 112 formed vertically between the protrusion 111 of the spacer wafer 102 and the actuation structure 101a. as a result, the protrusion 111 is vertically separated from the MEMS wafer 102 by the recess 112 so as not to interfere with the actuation and motion of the MEMS mirror 12.

In FIG. 2C, the transparent cover wafer 103 also protrudes out over the actuation structures 101a by a same dimension as the protrusions 111. Thus, widths W1 and W2 are again equal. While this feature reduces the range of light receiving angles and light transmission angles, it also reduces the size of the MEMS mirror package assembly 200C. In particular, the transparent dome structure 107 of assembly 200C has a lower maximum vertical height H2 and a smaller radius R2 when compared to assemblies 200A and 200B due to the smaller width W2.

By utilizing the thickness S1 of the spacer wafer 102 in assemblies 200A-200C, the apex of the dome structure 107 can be shifted in the vertical direction relative to the mirror surface. This means that the width W1 of the optical access to the transparent opening can also be reduced by approximately S1 in assembly 200A, which ultimately reduces the footprint (component size) of the assembly.

Both the cavity wafer 104 and transparent cover wafer 103 wafer must be irreversibly and hermetically connected to the MEMS wafer 101. The requirement for the cohesive, hermetic connection results from the necessary requirement for a low level of damping of the mirror oscillation in the case of resonance. This can only be achieved with the aid of a vacuum or a low pressure within the mirror cavity (i.e., the enclosed volume). The possible bond connections or methods used are explained in more detail below.

The package at wafer level not only significantly reduces the costs and effort for package generation, but also creates further degrees of freedom in processing and reproducibility. If the respective MEMS mirror 12 is already encapsulated in the front end, further particle contamination of the device during testing, preassembly, and possibly assembly (PCB assembly) is excluded.

A large number of materials are conceivable for the spacer wafer 102, such as silicon (Si), silicon carbide (SiC), gallium nitride (GaN), and glass (e.g., soda-lime glass, alkaline glass, borosilicate glass, float glass, quartz glass, etc.). It is important that the spacer wafer 102 can be irreversibly and hermetically connected to both the transparent cover wafer 103 and the MEMS wafer 101, which is a semiconductor wafer. The spacer wafer 102 can be a metal plate or thick metal layer as well, as long as the bonding of the transparent cover wafer 103 to the spacer wafer 102 is hermetic (e.g., eutectic bonding). Thus, the spacer wafer 102 is made of a material capable of being hermetically bonded to both the transparent cover wafer 103 and the MEMS wafer 101. The integrity of the connection should also be able to guarantee a glass reflow process at at least 700° C. In the following description, silicon is chosen as the spacer wafer material, since a hermetic connection between glass and silicon can be generated easily with the aid of an anodic bonding process. In the event that a different spacer material is used, the surface must be conditioned according to the requirements of the bond connection or the bonding process, for example by depositing layers of poly-silicon or nitride.

A method of manufacturing the MEMS mirror package assemblies 200A-200C may first include hermetically bonding the transparent cover wafer 103 to the spacer wafer 102 and then forming the transparent dome structure 107. Once the upper lid wafers, including of the spacer wafer 102 and the transparent cover wafer 103, are hermetically connected together and the transparent dome structure 107 is formed, the upper lid wafers must be hermetically and irreversibly connected to the MEMS wafer 101. In other words, the spacer wafer 102 is hermetically bonded to the MEMS wafer 101, which may have already been hermetically bonded to the cavity wafer 104. Alternatively, the cavity wafer 104 may be bonded to the MEMS wafer 101 last.

Conventional bonding methods such as adhesive bonding are unsuitable for generating a long-term and hermetic connection. The main disadvantage of these connections is that they are not long-term stable against external influences such as moisture, chemicals, etc. In addition, there can be outgassing of the adhesive, which leads both to contamination and to a change in the internal pressure of the cavity. The different coefficients of expansion (CTEs) between adhesive and glass or silicon can locally change the stress conditions and thus the performance of the MEMS mirror. The low temperature stability is another reason why adhesive bonding is rather unsuitable for a hermetic connection.

Due to the Si to Si material combination selected here for wafers 101 and 102 (i.e., both wafers are made from silicon), anodic bonding is also not suitable for a material bond, even if this method would have advantages with regard to the required surface quality (<20 nm) and process temperatures (<=400° C.).

In principle, silicon can be connected to silicon via what is known as fusion bonding at room temperature. While quite different materials can be bonded to one another with this bond connection, the main disadvantage of the method is the extremely high requirements in terms of surface planarity and roughness. RMS values of <0.5 nm on both sides of the material interface are a basic requirement for a successful and stable connection. However, the requirements for the surface quality can only be met in practice with considerable effort.

Novel connection methods such as glass microwelding only require light contact between the surfaces to be connected. The hermetic connection between glass/glass or glass/Si is generated by locally melting glass with the aid of a laser. However, for the use of this connection method, the spacer wafer material is made of glass. For example, quartz glass may be selected.

Quartz glass has a significantly higher softening point (~1130° C.) than borosilicate glass and is therefore suitable for the dome glass reflow process. The connection between the quartz glass of the spacer wafer 102 and the dome glass of the transparent cover wafer 103 should then also be carried out using this method.

For the Si/Si interface selected here for wafers 101 and 102 (i.e., both wafers are made from silicon), eutectic bonding or bonding with the aid of glass frit/pastes is possible.

Eutectic bonding is usually done with the help of one or more metal layers (Au or TiW/Au). Under the influence of a controlled force, at a sufficiently high temperature, a diffusion zone forms at the eutectic point, which can ensure a material bond between the most varied of materials. The main advantage of this bonding process is the ability to even out larger unevenness in the joining surfaces. The contamination potential of Au as a critical material should be considered when using this type of bonding. The materials to be connected should also be matched in CTE.

Bonding with the help of glass frit/pastes is also conceivable for a hermetic connection of two wafer substrates. While the application of the glass frit/paste and the burn-out of the solvent in the connection can still take place on one side (glass frit carrier substrate, the spacer wafer) and at moderate temperatures of <400° C., the final connection step (firing) is higher with process temperatures of up to 500° C. being necessary. The metallization on the MEMS wafer must be designed accordingly. As a rule, the glass frit/paste solder connections usually have a higher CTE than a Si substrate. These two major limitations must be considered when choosing this bonding method.

In both eutectic and glass-frit bonding, the Si-to-Si interface is pressed together under mechanical pressure, thus creating a cohesive and hermetic connection. The gas pressure within the mirror cavity should be as low as possible due to the lowest possible damping of the mirror, ideally a vacuum.

FIGS. 3A-3K illustrate a process flow for manufacturing an upper lid wafer stack of a MEMS mirror package assembly according to one or more embodiments. The upper lid wafer stack includes the spacer wafer 102 and the transparent cover wafer 103. Once the upper lid wafers, including of the spacer wafer 102 and the transparent cover wafer 103, are hermetically connected together and the transparent dome structure 107 is formed, the upper lid wafers are hermetically and irreversibly connected to the MEMS wafer 101.

Figure 3A:
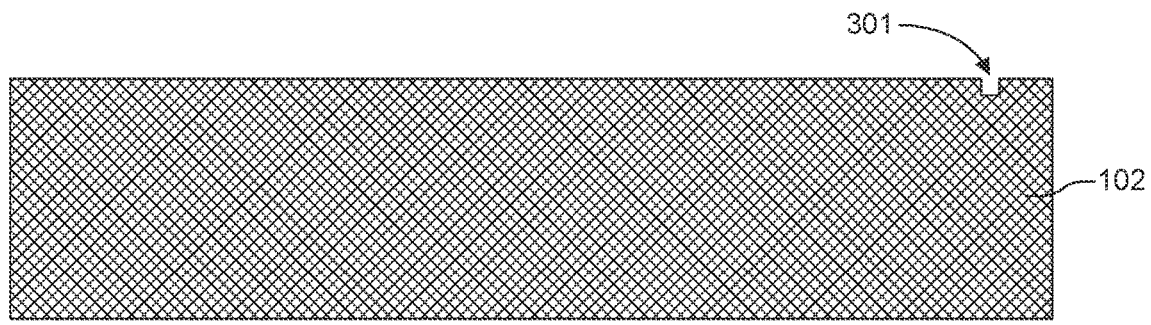
FIGS. 3A-3K illustrate a process flow for manufacturing an upper lid wafer stack of a MEMS mirror package assembly according to one or more embodiments.

In FIG. 3A, an alignment mark 301 is formed in the spacer wafer 102 using lithography and etching processes.

Figure 3B:
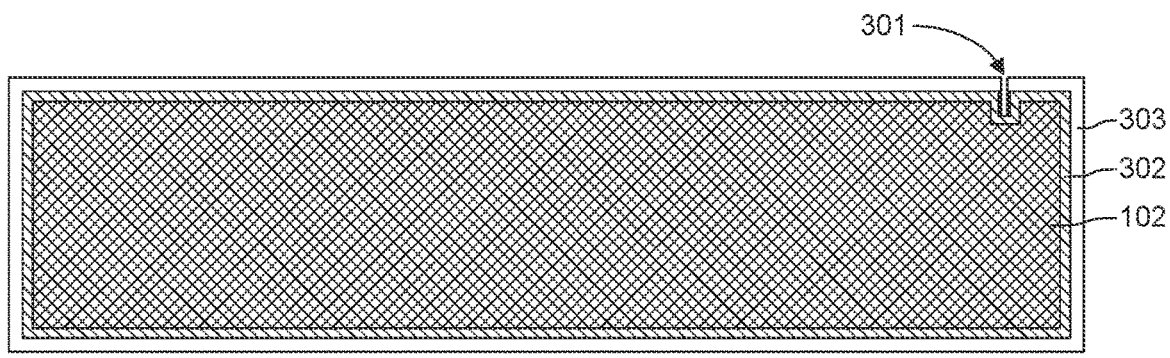

In FIG. 3B, the spacer wafer 102 is completely encapsulated with a nitride layer 302 (e.g., 70-290 nm thick) and a poly-silicon layer 303 (e.g., 100-1000 nm thick). The nitride layer 302 serves as a hard mask for the wet-chemical rear-side structuring. Other materials are also suitable as a hard mask. In addition to nitride, a thick oxide (SiO) (e.g., 200-1000 nm thick) or carbon-based materials (SiC, a-CH) (e.g., 30-1000 nm thick) are conceivable. The selectivity of the material to anisotropic Si etching solutions such as TMAH, KOH, and NaOH is important. If the back is subsequently opened using a plasma process, simple photoresists can also be used as a mask. In that case, encapsulation of the spacer wafer 102 or wafer edge can be omitted. Typical passivation materials for the wafer edge are dielectric materials such as SiO2 or Si3N4 but carbon-based materials (SiC, a-CH, etc.) are also conceivable.

In the present configuration, the poly-silicon layer 303 serves as a passivation for the nitride layer 302, since this has to be etched completely from the frontside and locally from the backside of the spacer wafer 102.

Figure 3C:
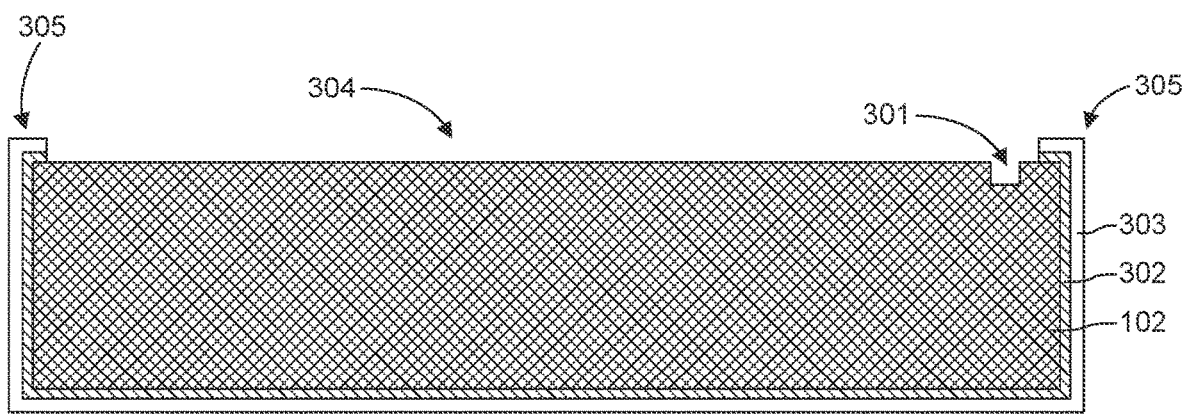

In FIG. 3C, a recess 304 is formed in the nitride layer 302 and the poly-silicon layer 303 on the frontside of the spacer wafer 102. The recess 304 extends through both layers 302 and 303 and extends to the front surface of the spacer wafer 102, while leaving the edge, side, and back portions of the two layers 302 and 303.

The recess 304 formed in the nitride layer 302 and the poly-silicon layer 303 is necessary in this particular process flow because the connection between glass and silicon is generated later with the help of an anodic bonding process. Here, dielectric materials at the interface between glass-Si would be more of a nuisance.

The recess 304 can be formed with the help of dry etching processes or with a combination of dry and wet chemical etching methods. It is important that the encapsulation of the wafer edge 305 (bevel) is completely retained so that it is not etched in the case of a wet-chemical rear side structuring. For this reason, an etching tool is used for the poly-silicon removal, which has a built-in ring that protects the wafer edge from the etching attack. Alternatively, protection of the wafer edge 305 with the aid of a photoresist or imide would be conceivable. The nitride removal can then take place again using standardized methods, since the typical etching chemistry for nitride (wet or dry) is sufficiently selective towards poly-silicon.

Figure 3D:
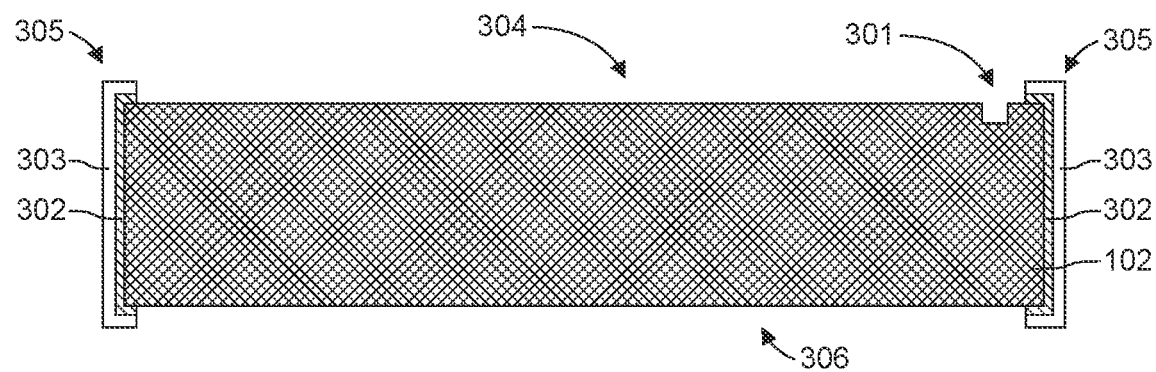

In FIG. 3D, a recess 306 is formed in the poly-silicon layer 303 on the backside of the spacer wafer 102. The recess 304 extends through poly-silicon layer 303 to the nitride layer 302, again while the edge and side portions of the two layers 302 and 303 intact. Thus, analogous to the front, the poly-silicon is removed from the rear.

Figure 3E:
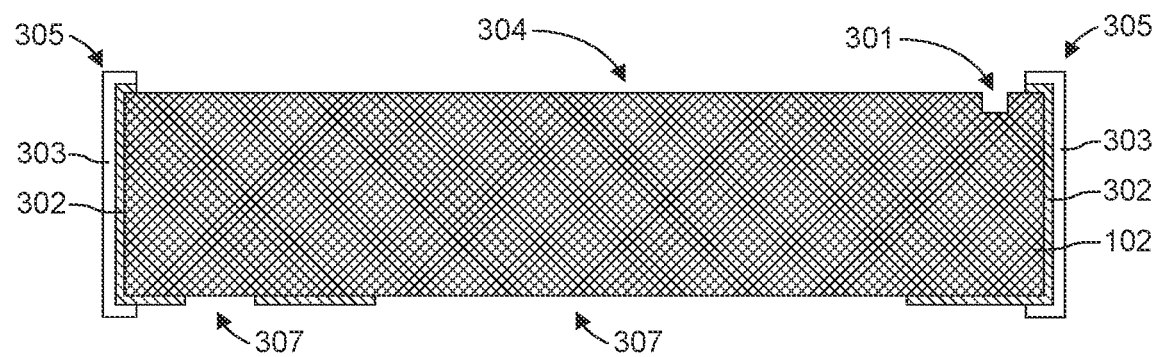

In FIG. 3E, the nitride layer 302 is structured locally on the backside with the aid of lithography and dry etching. Thus, on the backside, localized recesses 307 are formed through the nitride layer 302 to expose the backside of the spacer wafer 102 in those locations.

Figure 3F:
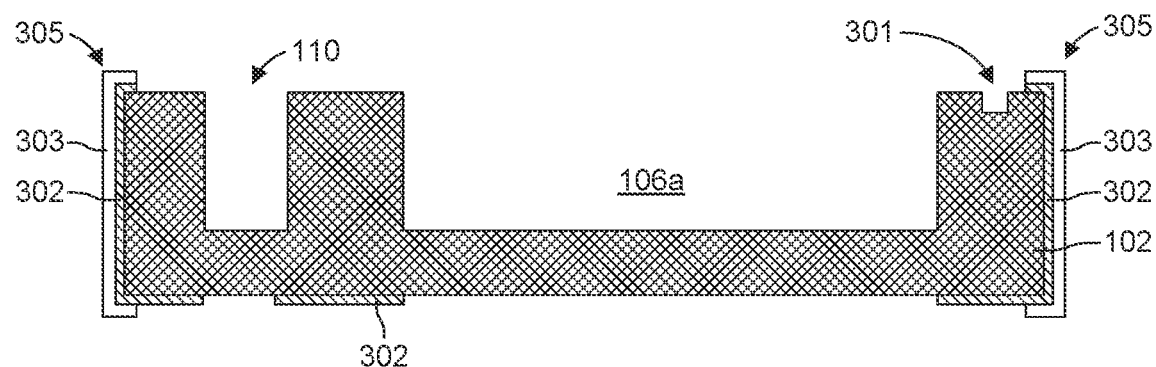

In FIG. 3F, the first portion 106a of the front cavity 106 and the opening 110 are partially formed, extending into the spacer wafer 102 from the frontside, using lithography and deep silicon etching.

Figure 3G:
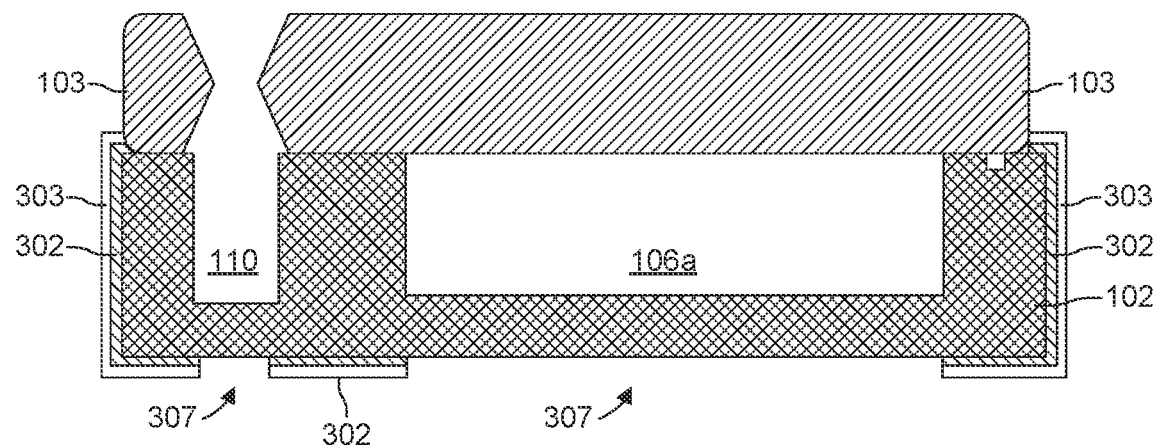

In FIG. 3G, the structure spacer wafer 102 is cleaned and a pre-structured glass wafer (i.e., the transparent cover wafer 103) is irreversibly and hermetically bonded to the silicon spacer wafer 102 with the aid of an anodic bonding process. A fusion bond between glass and Si would also be conceivable. The bond connection can be made to withstand a glass reflow process performed approximately at 700° C. In this stage, the transparent cover wafer 103 includes a frontside and a backside that are substantially flat. Upon hermetically bonding the transparent cover wafer 103 to the spacer wafer 102, the backside of the transparent cover wafer 103 encloses the first portion 106a of the front cavity 106.

The pre-structuring of the glass of the transparent cover wafer 103 would subsequently simplify the separation process. The existing openings or perforations in the glass are arranged in such a way that they later lie exactly over the corresponding contact pads of the MEMS chip. This makes it possible to test the MEMS structures at wafer level. If the glass is not pre-structured, the design should be designed in such a way that the openings above the contact pads are created using mechanical sawing processes (e.g., bridgecut dicing). The glass is sawn only locally in this area up to the edge of the wafer. The saw blade dips into the glass substrate just a little more than the existing glass thickness. The long glass strips created in this way are then flushed out in this area, giving access to the contact pads.

The disadvantage of the so-called bridgecut method is that a sawing process has to be implemented before the test at wafer level. The test can subsequently only be carried out on the saw frame, which entails restrictions with regard to the tester configuration. Furthermore, as already mentioned, the chip design and the position of the contact pads must be designed in such a way that they are parallel to one another in order to enable access using the dicing step. The openings in the spacer are to be created continuously up to the edge of the spacer. This can lead to increased stress up to the breakage of the Si/glass stack after the anodic bond. Thus, the pre-structuring of the glass substrate shows some advantages compared to the bridgecut method explained.

During the bonding process, the pressure under which the connection is generated is also important. For the subsequent glass reflow process, the pressure inside the cavity should be between two and three bar (i.e., an overpressure). In other words, the first portion 106a of a front cavity 106 is pressurized with an overpressure. Higher pressures usually require special precautions when configuring the system for safety reasons, but they are conceivable. An inert gas such as nitrogen can be used as the carrier gas or filling gas that fills the first portion 106a of the front cavity 106. In general, for a predefined dome height, the higher the pressure, the lower the cavity depth or the cavity volume may be. Dome height, cavity depth/volume, and internal pressure are mutually dependent parameters for forming the transparent dome structure 107 in the next process step.

Figure 3H:
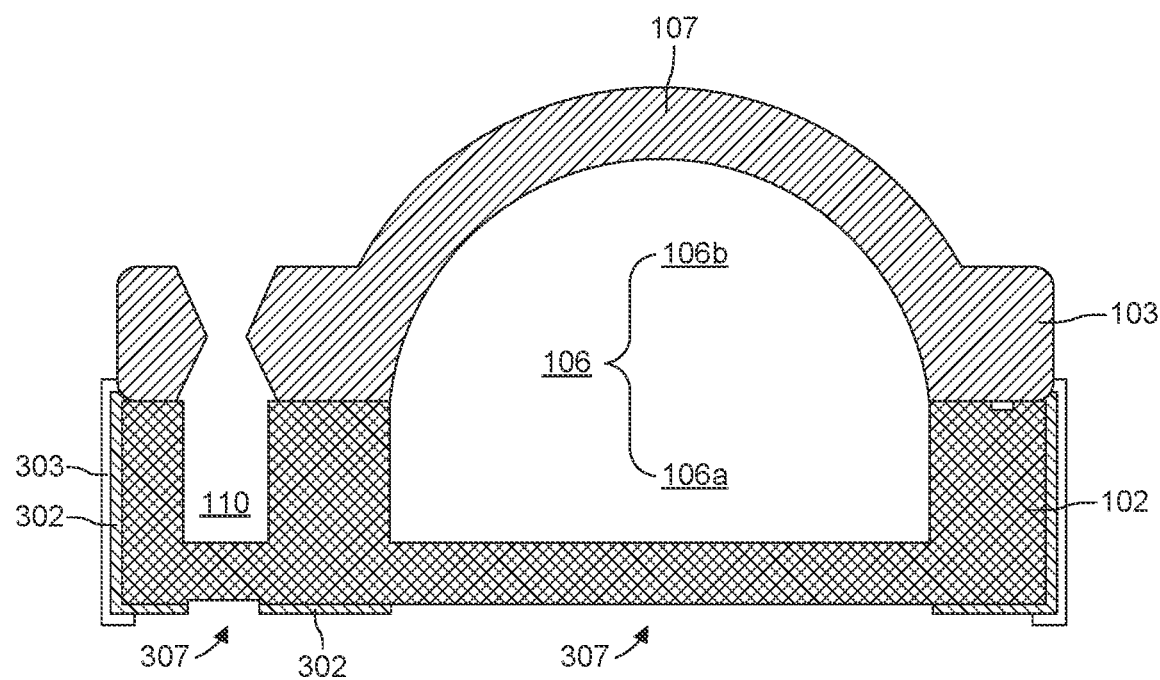

In FIG. 3H, a heating process, also referred to as a glass reflow process, is applied to the stacked wafer structure. In particular, the stacked wafer structure from FIG. 3G is heated to at least a transition temperature of the transparent cover wafer 103 at which the transparent cover wafer transitions into a viscous or rubbery state. The heating of the transparent cover wafer 103 to at least the transition temperature of the transparent cover wafer 103 and the overpressure within cavity 106a causes a portion of the transparent cover wafer 103 that is arranged over the first portion 106a of a front cavity 106 to bulge into a bubble (i.e., a symmetrical blow-up of the glass) to thereby form a transparent dome structure 107 that defines a second portion 106b of the front cavity 106. In other words, upon heating the transparent cover wafer 103 to at least the transition temperature of the transparent cover wafer, the enclosed gas within the first portion 106a of a front cavity 106 expands isothermally due to the overpressure to enlarge a volume of the second portion 106b of the front cavity 106 until a pressure inside the front cavity 106 corresponds to an external pressure (e.g., the pressure inside a furnace).

It is further conceivable that heating the transparent cover wafer 103 to at least the transition temperature of the transparent cover wafer includes heating the transparent cover wafer 103 to at least a softening point of the transparent cover wafer at which the transparent cover wafer behaves like a Newtonian liquid. The transparent dome structure 107 is then allowed to cool and harden. As a result, the bulge is retained and therefore a vacuum pressure or a low pressure arises inside.

If the spacer wafer 102 is made of glass, it should be a different glass with a higher transition temperature/softening point than the glass of the transparent cover wafer 103. For example, the spacer wafer could be quartz glass and the transparent cover wafer 103 could be borosilicate glass. In this way the temperature to form the transparent dome structure 107 can be reached without affecting the integrity of the spacer wafer 102.

As an alternative to the process flow described so far, a so-called sacking method for generating the dome structure would also be conceivable The poly-silicon 303 is removed insitu during the backside opening in an alkaline solution. The nitride 302 can be removed (e.g., by wet etching with hot phosphoric acid) but can also stay on the backside.

Figure 3I:
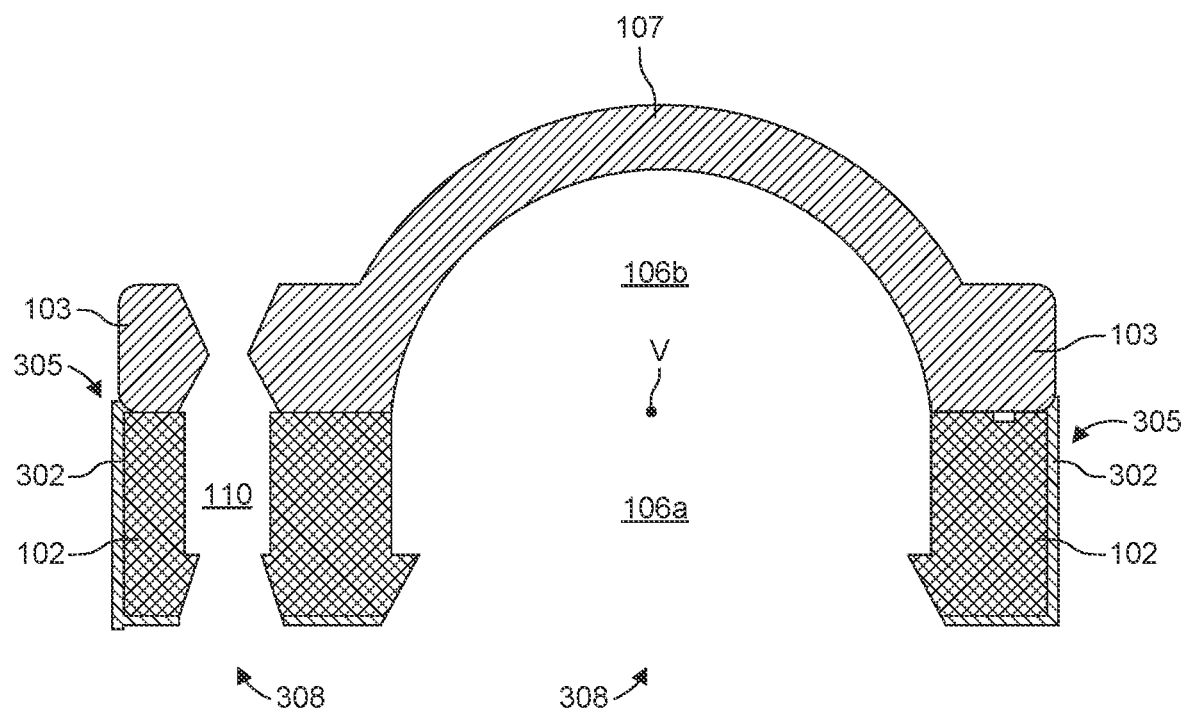

In FIG. 3I, backside openings 308 are formed at the backside of the spacer wafer 102. The poly-silicon 303 has also been removed at the wafer edge 305. The backside openings 308 can be formed either with the help of anisotropic wet-chemical etching with alkaline solutions (TMAH, KOH, NaOH, etc.) or with the help of dry etching (DRIE). In the case of wet-chemical etching, the wafer edge of the spacer substrate must be adequately protected from the etching solution in order to avoid an etching attack, unless etching is carried out in specially manufactured holders that enable one-sided etching.

Once the backside openings 308 are formed, the process may proceed to hermetically bonding the backside of the spacer wafer 102 to a frontside of a MEMS wafer 101, where the MEMS wafer includes a stator portion that is rotationally fixed and a rotor portion that includes a MEMS mirror 12 configured to rotate about at least one axis, wherein the MEMS mirror is suspended from the stator portion over a back cavity, wherein the MEMS wafer defines a first portion of the back cavity. The center of the MEMS mirror 12 is arranged substantially at a vertex of the transparent dome structure 107.

In addition, the process flow further includes hermetically bonding a backside of the MEMS wafer 101 to a cavity wafer 104, wherein the cavity wafer 104 includes a back cavity recess 105b that defines a second portion of the back cavity 105. As a result, the cavity wafer 104, the spacer wafer 102, the MEMS wafer 101, and the transparent cover wafer 103 form an enclosed, hermetically sealed volume around the MEMS mirror 12, where the enclosed volume comprises the front cavity 106 and the back cavity 105. The enclosed volume 105, 106 is pressurized with aa vacuum pressure or a low pressure to prevent damping of the mirror's motion.

Figure 3J:
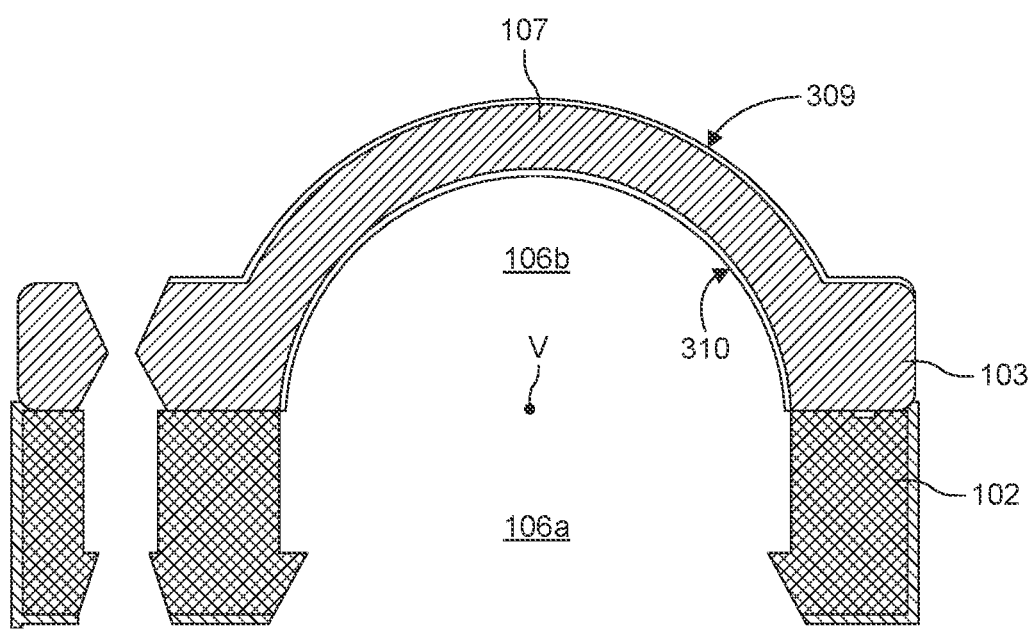

In FIG. 3J, an anti-reflective (AR) coating 309 is applied to the outer side (external surface) of the transparent dome structure 107 and an anti-reflective coating 310 is applied to the inner side (internal surface) of the transparent dome structure 107. For the wavelength in the range of 450-650 nm, the reflectance of the AR coatings 309 and 310 should be less than 1%, and more preferably less than 0.5%. The AR coatings 309 and 310 can include multiple layers, e.g., dielectrics like SiO2, SiON, and Si3N4. The thickness of each layer should be in a range of 50-400 nm. A multilayer stack of SiO2 plus AlN, TiO2 or Si3N4 would work as well. The anti-reflective coatings 309 and 310 should be at least on one side (outer side) of the transparent dome structure 107, but preferably on both sides (inner and outer sides). The AR coatings 309 and/or 310 are applied to the transparent dome structure 107 after the dome's formation (i.e., after FIG. 3I) but before the spacer+glass stack (102+103) stack) is bonded to the frontside of the MEMS wafer 101 frontside. The deposition can be done by plasma enhanced CVD methods (PECVD) at 400° C., PVD methods (sputtering), or Atomic Layer Deposition (ALD) methods, for example.

Figure 3K:
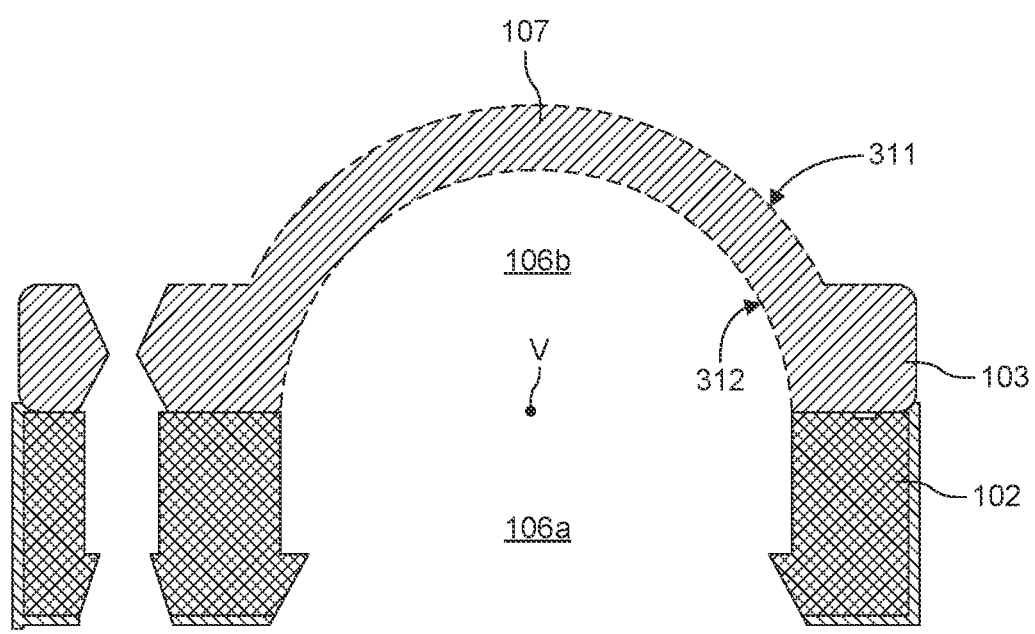

FIG. 3K illustrates an alternative step to that shown in FIG. 3J. Thus, instead of applying the AR coatings 309 and 310 as shown in FIG. 3J, meta-structures can be formed on the outer and the inner surfaces of the transparent dome structure 107. Thus, a layer of meta-structures 311 can be formed on the outer side (external surface) of the transparent dome structure 107 and a layer of meta-structures 311 is formed on the inner side (internal surface) of the transparent dome structure 107. The layer of meta-structures should be at least on one side (outer side) of the transparent dome structure 107, but preferably on both sides (inner and outer sides). The layers of meta-structures 311 and 312 can be formed by a pre-structured (etched) porous surface (in a nanometer range) such that the meta-structures of each layer form an array of anti-reflective structures. In other words, the meta-structures of each layer are dimensioned in the nanometer range to form an array that acts as an AR layer.

The etching/conditioning to form the meta-structures can be done either before heating and reforming the glass (i.e., before dome formation) or after the reflow (i.e., after dome formation). For example, the etching/conditioning could be performed before the glass substrate 103 is bonded to the frontside of the spacer wafer 102 in FIG. 3G or after the formation of the done in FIG. 3I.

In summary of the example process flow, a method of manufacturing a MEMS mirror package assembly includes: structuring a first portion of a front cavity in a spacer wafer, wherein the first portion of the front cavity extends vertically into the spacer wafer by extending from a frontside of the spacer wafer partially towards a backside of the spacer wafer; hermetically bonding a transparent cover wafer to the frontside of the spacer wafer, wherein the transparent cover wafer comprises a frontside and a backside that are substantially flat, wherein the backside of the transparent cover wafer encloses the first portion of a front cavity; pressurizing the first portion of a front cavity with an overpressure; heating the transparent cover wafer to at least a transition temperature of the transparent cover wafer at which the transparent cover wafer transitions into a viscous or rubbery state, wherein heating the transparent cover wafer to at least the transition temperature of the transparent cover wafer and the overpressure causes a portion of the transparent cover wafer that is arranged over the first portion of a front cavity to bulge into a bubble to thereby form a transparent dome structure that defines a second portion of the front cavity; hermetically bonding the backside of the spacer wafer to a frontside of a MEMS wafer, wherein the MEMS wafer comprises a stator portion that is rotationally fixed and a rotor portion that includes a MEMS mirror configured to rotate about at least one axis, wherein the MEMS mirror is suspended from the stator portion over a back cavity, wherein the MEMS wafer defines a first portion of the back cavity, wherein a center of the MEMS mirror is arranged substantially at a vertex of the transparent dome structure; and hermetically bonding a backside of the MEMS wafer to a cavity wafer, wherein the cavity wafer includes a back cavity recess that defines a second portion of the back cavity, wherein the cavity wafer, the spacer wafer, the MEMS wafer, and the transparent cover wafer form an enclosed volume around the MEMS mirror, wherein the enclosed volume comprises the front cavity and the back cavity.

The process flow may also include forming one or more electrical pads 109 at the frontside of the MEMS wafer 101 in the opening 110. This may include forming an opening over the electrical pad, wherein the opening extends entirely through a thickness of the transparent cover wafer 103 and a thickness of the spacer wafer 102 to expose the electrical pad, wherein the opening is laterally displaced from the transparent dome structure 107.

As a result of this process that includes the spacer wafer 102, the apex (height) of the transparent dome structure 107 is reduced towards the MEMS mirror 12 (i.e., towards the vertex V) by at least a thickness S1 of the spacer wafer 102 and a width (e.g., width) W1 of the front cavity 106 at the MEMS mirror 12 is reduced by at least a thickness S1 of the spacer wafer 102. For example, the substrate thickness for the spacer wafer 102 can be set variably between 50 and 1000 µm. Restrictions arise only from the cavity volume required for the reflow. With a maximum etching depth of approximately 400 to 500 µm, the spacer substrate should have a thickness of at least 600 µm in order to ensure sufficient stability for handling and subsequent processes.

There are also other parameters that determine the quality of the dome structure and must be monitored during production. For example, the surface roughness of the glass of wafer 103 after the reflow process should not be much more than 2 nm in order to be able to guarantee an interference-free light transmission of at least 98%.

In view of the above, implementation of the spacer wafer 102 in the stack of the upper lid wafer can reduce the footprint of the overall device by at least the spacer thickness S1. The effective dome height is reduced at the same time, which from a mechanical point of view usually ensures greater stability of the component.

In summary, the structure generation of a 3D wafer level package for optical MEMS applications (MOEMS) is performed with the help of a reflow method for generating dome structures. The spacer wafer used to create the structure is integrated into the overall system. The corresponding pre-structuring of the dome glass also enables the elimination of additional sawing processes in the process flow of the component at wafer level. The combination of the structure specifics as well as the process route has some cost advantages and degrees of freedom compared to the current methods, which have an effect in particular on the possible structural geometries and reproducibility. The irreversible and hermetic connection of the 3D glass produced in this way with the MEMS substrate can be made with the help of glass frit or eutectic bonding processes due to the materials selected here.

Although embodiments described herein relate to a MEMS device with a mirror, it is to be understood that other implementations may include optical devices other than MEMS mirror devices. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer, or an electronic circuit. In some embodiments, some one or more of the method steps may be executed by such an apparatus.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid in the understanding of the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Thus, it is understood that modifications and variations of the arrangements and the details described herein will be apparent to others skilled in the art.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:

1. A microelectromechanical systems (MEMS) mirror package assembly, comprising:
   a MEMS wafer comprising a stator portion that is rotationally fixed and a rotor portion that includes a MEMS mirror configured to rotate about at least one axis, wherein the MEMS mirror is suspended from the stator portion over a back cavity, the MEMS wafer comprising a frontside and a backside, wherein the MEMS wafer defines a first portion of the back cavity;
   a spacer wafer comprising a frontside and a backside, wherein the backside of the spacer wafer is bonded to the frontside of the MEMS wafer, wherein the spacer wafer defines a first portion of a front cavity arranged over the MEMS mirror; and
   a transparent cover wafer comprising a frontside and a backside, wherein the backside of the transparent cover wafer is bonded to the frontside of the spacer wafer, wherein the transparent cover wafer comprises a transparent dome structure arranged over the MEMS mirror and defining a second portion of the front cavity, wherein a center of the MEMS mirror is arranged substantially at a vertex of the transparent dome structure, and wherein the MEMS wafer includes one or more back cavity recesses, that define the first portion of the back cavity, through which the MEMS mirror moves during movement.

2. The MEMS mirror package assembly of claim 1, further comprising:

a cavity wafer bonded to the backside of the MEMS wafer, wherein the cavity wafer includes a back cavity recess that defines a second portion of the back cavity, wherein the cavity wafer, the spacer wafer, the MEMS wafer, and the transparent cover wafer form an enclosed volume around the MEMS mirror, wherein the enclosed volume comprises the front cavity and the back cavity.

3. The MEMS mirror package assembly of claim 2, wherein the enclosed volume is a hermetically sealed volume.

4. The MEMS mirror package assembly of claim 2, wherein the enclosed volume has a vacuum pressure or a low pressure.

5. The MEMS mirror package assembly of claim 2, wherein the backside of the spacer wafer is hermetically bonded to the frontside of the MEMS wafer, the backside of the transparent cover wafer is hermetically bonded to the frontside of the spacer wafer, and the cavity wafer is hermetically bonded to the backside of the MEMS wafer.

6. The MEMS mirror package assembly of claim 1, wherein the backside of the spacer wafer is hermetically bonded to the frontside of the MEMS wafer, and the backside of the transparent cover wafer is hermetically bonded to the frontside of the spacer wafer.

7. The MEMS mirror package assembly of claim 1, wherein the MEMS mirror is part of a one-piece integral member of the MEMS wafer.

8. The MEMS mirror package assembly of claim 1, wherein:

the MEMS wafer comprises an actuation structure configured to actuate a rotation of the MEMS mirror about at least one axis, and the spacer wafer includes a protrusion that laterally extends over the actuation structure.

9. The MEMS mirror package assembly of claim 8, wherein the first portion of the front cavity includes a recess formed vertically between the protrusion of the spacer wafer and the actuation structure, wherein the protrusion is vertically separated from the MEMS wafer by the recess.

10. The MEMS mirror package assembly of claim 1, wherein a width of the first portion of the front cavity defined by the spacer wafer is equal to a width of the second portion of the front cavity defined by the transparent cover wafer.

11. The MEMS mirror package assembly of claim 1, wherein a width of the first portion of the front cavity defined by the spacer wafer is less than a width of the second portion of the front cavity defined by the transparent cover wafer.

12. The MEMS mirror package assembly of claim 1, further comprising:

an electrical pad formed at the frontside of the MEMS wafer; and an opening arranged over the electrical pad, wherein the opening extends entirely through a thickness of the transparent cover wafer and a thickness of the spacer wafer to expose the electrical pad, wherein the opening is laterally displaced from the transparent dome structure.

13. The MEMS mirror package assembly of claim 1, wherein:

the MEMS wafer is a semiconductor wafer,
the transparent cover wafer is made of glass,
the spacer wafer is a material capable of being hermetically bonded to both the transparent cover wafer and the MEMS wafer.

14. The MEMS mirror package assembly of claim 1, further comprising:

a getter structure arranged inside the back cavity.

15. The MEMS mirror package assembly of claim 1, further comprising:

an anti-reflective layer formed on a surface of the transparent dome structure.

16. A microelectromechanical systems (MEMS) mirror package assembly, comprising:

a MEMS wafer comprising a stator portion that is rotationally fixed and a rotor portion that includes a MEMS mirror configured to rotate about at least one axis, wherein the MEMS mirror is suspended from the stator portion over a back cavity, the MEMS wafer comprising a frontside and a backside, wherein the MEMS wafer defines a first portion of the back cavity;

a spacer wafer comprising a frontside and a backside, wherein the backside of the spacer wafer is bonded to the frontside of the MEMS wafer, wherein the spacer wafer defines a first portion of a front cavity arranged over the MEMS mirror; and a transparent cover wafer comprising a frontside and a backside, wherein the backside of the transparent cover wafer is bonded to the frontside of the spacer wafer, wherein the transparent cover wafer comprises a transparent dome structure arranged over the MEMS mirror and defining a second portion of the front cavity, wherein a center of the MEMS mirror is arranged at a vertex of the transparent dome structure.

17. The MEMS mirror package assembly of claim 16, wherein the center of the MEMS mirror is arranged at a half diameter of the transparent dome structure.

18. The MEMS mirror package assembly of claim 16, wherein:

the MEMS wafer comprises an actuation structure configured to actuate a rotation of the MEMS mirror about at least one axis, and the spacer wafer includes a protrusion that laterally extends over the actuation structure.

19. A microelectromechanical systems (MEMS) mirror package assembly, comprising:

a MEMS wafer comprising a stator portion that is rotationally fixed and a rotor portion that includes a MEMS mirror configured to rotate about at least one axis, wherein the MEMS mirror is suspended from the stator portion over a back cavity, the MEMS wafer comprising a frontside and a backside, wherein the MEMS wafer defines a first portion of the back cavity;

a spacer wafer comprising a frontside and a backside, wherein the backside of the spacer wafer is bonded to the frontside of the MEMS wafer, wherein the spacer wafer defines a first portion of a front cavity arranged over the MEMS mirror; and a transparent cover wafer comprising a frontside and a backside, wherein the backside of the transparent cover wafer is bonded to the frontside of the spacer wafer, wherein the transparent cover wafer comprises a transparent dome structure arranged over the MEMS mirror and defining a second portion of the front cavity, wherein a center of the MEMS mirror is arranged substantially at a vertex of the transparent dome structure, and wherein the transparent dome structure has a curvature that forms an imaginary circle around the MEMS mirror, with the center of the MEMS mirror being arranged substantially at a center of the imaginary circle.

20. The MEMS mirror package assembly of claim 19, wherein the at least one axis intersects with the center of the imaginary circle.

21. The MEMS mirror package assembly of claim 19, wherein a backside of the imaginary circle is confined to the MEMS wafer and the back cavity such that the backside of the imaginary circle is contained entirely within the MEMS mirror package assembly.

22. The MEMS mirror package assembly of claim 19, wherein the imaginary circle passes through the back cavity.

23. The MEMS mirror package assembly of claim 19, wherein the imaginary circle is confined to the MEMS mirror package assembly.

24. The MEMS mirror package assembly of claim 19, further comprising:

a cavity wafer bonded to the backside of the MEMS wafer, wherein the cavity wafer includes a back cavity recess that defines a second portion of the back cavity, wherein the cavity wafer, the spacer wafer, the MEMS wafer, and the transparent cover wafer form an enclosed volume around the MEMS mirror, wherein the enclosed volume comprises the front cavity and the back cavity.

25. The MEMS mirror package assembly of claim 19, wherein:

the MEMS wafer comprises an actuation structure configured to actuate a rotation of the MEMS mirror about at least one axis, and the spacer wafer includes a protrusion that laterally extends over the actuation structure.

26. The MEMS mirror package assembly of claim 19, further comprising:

an electrical pad formed at the frontside of the MEMS wafer; and an opening arranged over the electrical pad, wherein the opening extends entirely through a thickness of the transparent cover wafer and a thickness of the spacer wafer to expose the electrical pad, wherein the opening is laterally displaced from the transparent dome structure.

\* \* \* \* \*